United States Patent [19]

Sénès

[11] 4,177,478
[45] Dec. 4, 1979

[54] AMPLIFYING GATE THYRISTOR WITH GATE TURN-OFF (G.T.O.)

[75] Inventor: Albert Sénès, L'Hay les Roses, France

[73] Assignee: Alsthom-Atlantique, Paris, France

[21] Appl. No.: 866,897

[22] Filed: Jan. 4, 1978

[30] Foreign Application Priority Data

Jan. 10, 1977 [FR] France .................. 77 00471

[51] Int. Cl.² .......................................... H01L 29/74
[52] U.S. Cl. ........................................ 357/38; 357/68; 357/86; 357/89; 357/90
[58] Field of Search ................... 357/38, 86, 89, 90, 357/68

[56] References Cited

U.S. PATENT DOCUMENTS

| | | | |
|---|---|---|---|
| 3,641,403 | 2/1972 | Nakata | 357/38 |
| 3,693,054 | 9/1972 | Anderson | 357/38 |
| 3,896,476 | 7/1975 | Kawakami | 357/38 |
| 3,906,545 | 9/1975 | Schlangenotto et al. | 357/38 |
| 3,967,294 | 6/1976 | Takase et al. | 357/38 |

FOREIGN PATENT DOCUMENTS

| | | | |
|---|---|---|---|
| 1803935 | 10/1969 | Fed. Rep. of Germany | 357/38 |
| 2500384 | 11/1975 | Fed. Rep. of Germany | 357/38 |
| 2299727 | 8/1976 | France | 357/38 |

OTHER PUBLICATIONS

J. Shimizu et al., "High-Voltage High-Power Gate-Assisted Turn-Off Thyristor for High-Frequency Use," IEEE Trans. on Elec. Dev., vol. ED-23, #8, Aug. 1976, pp. 883-887.

Primary Examiner—Joseph E. Clawson, Jr.
Attorney, Agent, or Firm—Sughrue, Rothwell, Mion, Zinn and Macpeak

[57] ABSTRACT

The invention relates to an amplifying gate thyristor with gate turn-off (G.T.O.) for electric power switching. A P+ type conduction layer is disposed in the thickness of the base P1, forming a buried grate under the main emitter and penetrating down to an N layer designed to transmit to the base the negative pulses applied to the gate opening the thyristor.

3 Claims, 6 Drawing Figures

AMPLIFYING GATE THYRISTOR WITH GATE TURN-OFF (G.T.O.)

The invention relates to an amplifying gate thyristor with gate turn-off (GTO).

A known amplifying gate thyrister comprises:

a monocrystalline semi-conductor wafer with an anode surface and a cathode surface, this wafer comprising successively, from the anode surface up to the cathode surface, a P type injection layer, an N type blocking layer, a P type base and a layer of N type emitters leaving gaps which are occupied by the base, so that the cathode surface comprises: a first base zone, e.g. in a central zone; a trigger emitter surrounding the central zone, an intermediate base zone surrounding the trigger emitter; and a main emitter surrounding the intermediate zone and having a greater area than the trigger emitter. This wafer is coated with metal coverings which are on the cathode surface:

a gate formed by a metal layer deposited on the central base zone at a distance from the trigger emitter;

a metallization of the trigger emitter, said metallization being deposited on the trigger emitter while remaining at a distance from the central base zone and overlapping on the intermediate zone so as to form a transmission metallization over this zone; and a cathode formed by a metal layer deposited on the main emitter at a distance from the intermediate base zone.

An anode is formed by a metal layer deposited on the anode surface.

Two main terminals are connected, the one to the anode and the other to the cathode. A control terminal is connected to the gate.

In such a thyristor, the trigger emitter is intended to facilitate firing by means of a low energy pulse. It is disposed between the gate and the main emitter so that, with the thyristor being turned off and under direct voltage between the anode and the cathode which is situated on the main emitter, and with the trigger emitter at a floating potential, a suitable positive signal applied to the gate initially fires a "trigger" thyristor whose emitter is constituted by the trigger emitter, and which constitutes an amplifier for the trigger signal.

To facilitate the description, various more or less successive phases in the firing process can be very roughly distinguished:

First phase:

The signal applied to the gate causes the injection of minority carriers in the base from the trigger emitter.

Second phase:

The above injection fires the trigger thyristor according to the conventional process, thus raising the potential of the trigger emitter.

Third phase:

The above rise in potential causes current to flow from the trigger emitter towards the main cathode. This current will be called the "triggering current" hereinbelow.

Fourth phase:

The triggering current causes an injection of minority carriers into the base from the main emitter through the corresponding junction, which will be called the "main junction" hereinbelow.

Fifth phase:

The above injection fires the main thyristor according to the conventional process, which was the object of the exercise, the advantage of the disposition described being that the power available for injection during the above fourth phase is very much greater than that which was applied to the gate.

The trigger emitter is separated from the main emitter so that the current flowing from the trigger emitter to the main cathode will pass via the base, this being favourable for injection through the main junction during the fourth phase.

The cathode is recessed in relation to the edge of the main emitter, at least on the trigger emitter side, so as not to short-circuit the main junction during the fourth phase. This obliges the triggering current to flow through the main junction.

The metallization of the trigger emitter is connected to the transmission metallization so that during the fourth phase, the triggering current does not have to pass through this junction in the reverse direction. Further, this latter metallization allows the potential of the trigger emitter to be applied to a large surface. The doping profile and the width of the intermediate region of the base are chosen to give a preferential value to the resistance between the trigger emitter and the main emitter.

The presence of the trigger emittter makes it possible to increase the triggering speed of the thyristor, i.e. the rate of current increase which the thyristor can withstand without destruction. It is known that if the current increases too rapidly, it reaches a high value before the effectively fired area of the thyristor will be sufficient to withstand these values. It is therefore an advantage to increase the speed at which the fired area increases. This fired area originates on the main junction and its initial rate of increase is substantially proportional to the length of the junction on the cathode surface, i.e. to the length of the outside edge of the triggering transmission zone. To increase this length, in the usual case of a circular semiconductor wafer extensions extending radially towards the edge of the wafer are often imparted to this transmission zone. The relatively high power available for injection during the fourth phase described previously then allows a suitable injection of minority carriers into the base from the main emitter all along the main junction despite the length thus increased of this junction at the cathode surface.

It has been proposed (in I E E Transactions on Electron devices, vol ED 23, No. 8, p. 883, by J Shimizu et al.) to produce a thyristor with a gate amplifier whose turning off could be accelerated by a negative pulse applied to the trigger when the voltage at the main terminals is nil. For this negative pulse to be effective, it is transmitted from the gate to the vicinity of the main emitter by means of metallization occupying a part of the intermediate base zone situated between the trigger emitter and the main emitter. However, the presence of such metallization has a disadvantage when a positive signal is applied to the gate to fire the thyristor:

Indeed, this metallization then transmits the positive signal to the vicinity of the main emitter without passing through the trigger emitter which is short-circuited and which therefore no longer fulfils its function. To avoid this disadvantage, it has therefore been proposed to form a localized N type layer in the base layer under the metallization so as to form a diode shunt with the P type base which shunt is conductive only for negative pulses coming from the gate. But a further disadvantage then appears and has up to the present prevented the use of such a diode shunt: indeed, the two N and P layers of the diode which are superimposed on the N blocking layer and on the P injection layer constitute an unwanted trigger thyristor. When it is required to turn off the main thyristor, the negative pulse applied to the gate is transmitted to the emitter of the unwanted thyristor and triggers it, thus inhibiting the main thryistor from turning off.

Also, thyristors with "buried grids" are known which have no trigger amplifier and in which the transmission of the control signals from the gate is facilitated by the presence of a conduction layer disposed in the thickness of the base layer and extending from the central zone of the base to under the main emitter. This conduction layer has P type doping which is heavier than that of the base layer so as to be a better electric conductor. The part situated under the main emitter forms a grid whose holes are occupied by the doping material of the base, so as to allow the negative carriers to pass through these holes from the main emitter to the blocking layer when the thyristor is conductive. Such a buried grate makes it possible to increase the triggering rate of the thyristor by transmitting the positive pulse of the gate to the vicinity of a large part of the area of the main emitter to cause an injection of negative carriers in the base, over this entire area. When the thyristor is conductive and when the negative control signal is applied to the gate, the buried grid also makes it possible to transmit this signal sufficiently far to cause the simultaneous turning off of the thyristor over the whole area of the main emitter.

Sometimes use is made of thyristors whose turn off is gate controlled, (G.T.O.), such thyristors are turned off by applying a large negative pulse to the gate so as to stop the injection of electrons by the emitter in the control layer even when there is a difference in potential between the cathode and the anode which promotes this injection.

The present invention aims to produce a G.T.O. amplifying gate thyristor making it possible to turn the thyristor off when there is a difference in potential between the main terminals which opposes turning off, without danger of triggering an unwanted trigger thyristor.

It provides an amplifying gate thyristor with gate turn off, comprising a semiconductor monocrystalline wafer with two surfaces which are an anode surface and a cathode surface and which are metallized, the surface of this wafer comprising five zones which succeed each other in the following order:
  a gate zone;
  a trigger amplification zone;
  a turn off zone;
  a trigger transmission zone;
  and a main zone;
the wafer comprising in these five zones a stack of semiconductor layers and superimposed metallization in the following order starting from the anode surface;
  an anode constituted by metallization;
  a P type semiconductor injection layer;
  an N type semiconductor blocking layer;
  and a P type semiconductor base layer reaching in some places the cathode surface;
the wafer comprising; in the gate zone, a gate constituted by metallization deposited on the base layer; in the trigger amplification zone a trigger emitter separated from the gate and constituted by an N type semiconductor layer disposed on the base layer and coated with trigger emitter metallization in the turn off zone, a shunt diode constituted by an N type semiconductor layer disposed on the base layer, this N layer being separated from the trigger emitter and coated with covering shunt diode metallization connected to the gate, in the trigger transmission zone, transmission metallization deposited on the base layer, separated from the shunt diode metallization and connected to the trigger emitter metallization; in the main zone, a main emitter constituted by an N type layer disposed on the base layer and coated with a cathode constituted by metallization separated from the transmission metallization; and a conduction layer situated in the thickness of the base layer and constituted by a P+ type semiconductor layer, in which the doping concentration is higher than that of the base layer, this conduction layer extending over the turn off zone, the trigger transmission zone and the main zone, forming in the main zone a buried grid whose gaps are occupied by the material of the base layer so as to allow the negative carriers to pass through these gaps from the main emitter to the blocking layer.

An embodiment of the invention is described by way of example with reference to the accompanying drawing in which.

Figure 2:
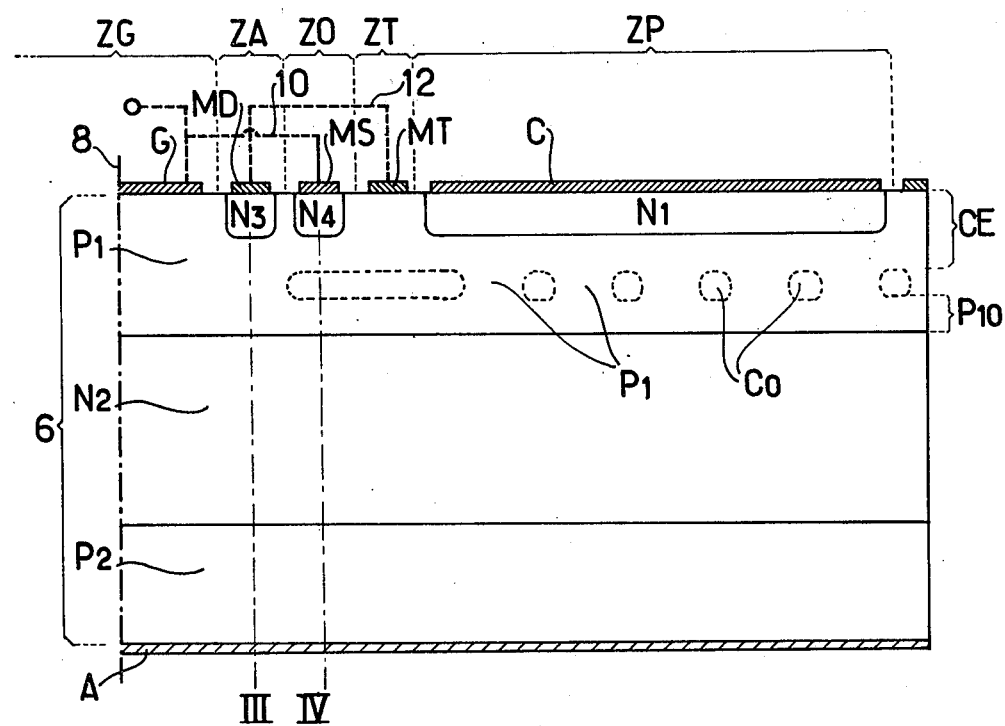
FIG. 2 shows partial cross-section view of a thyristor in accordance with the invention, in a plane passing through the axis of a circular plate constituting the semiconductive structure of the thyristor.
Figure 3:
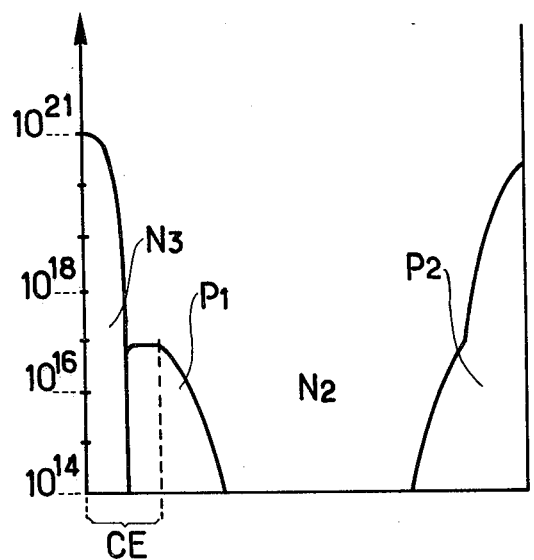
FIGS. 3 and 4 are diagrams of the concentration of the doping impurities in the thyristor of FIG. 2 as a function of the depth from the cathode surface, respectively in the trigger amplification zone and in the turn off zone.
Figure 5:
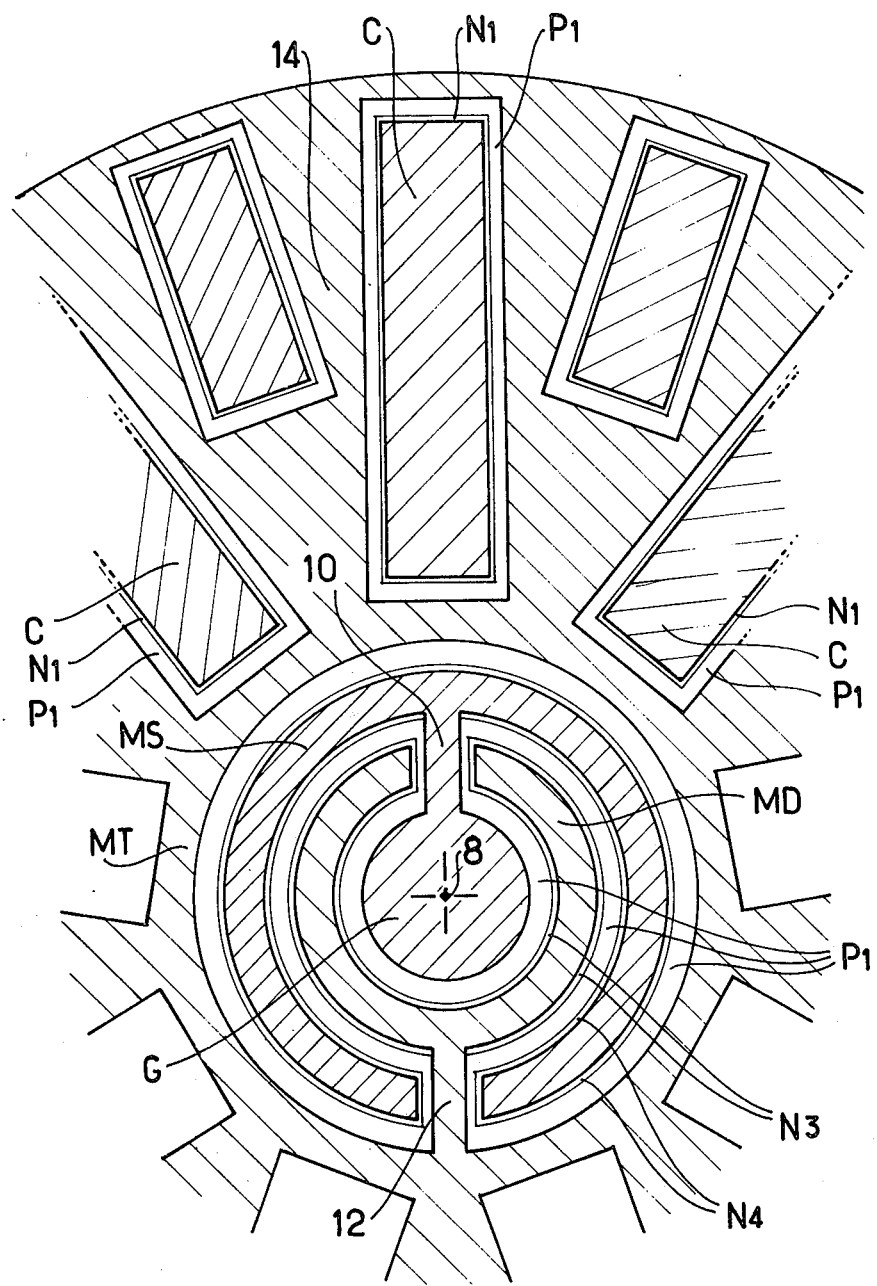
Figure 6:
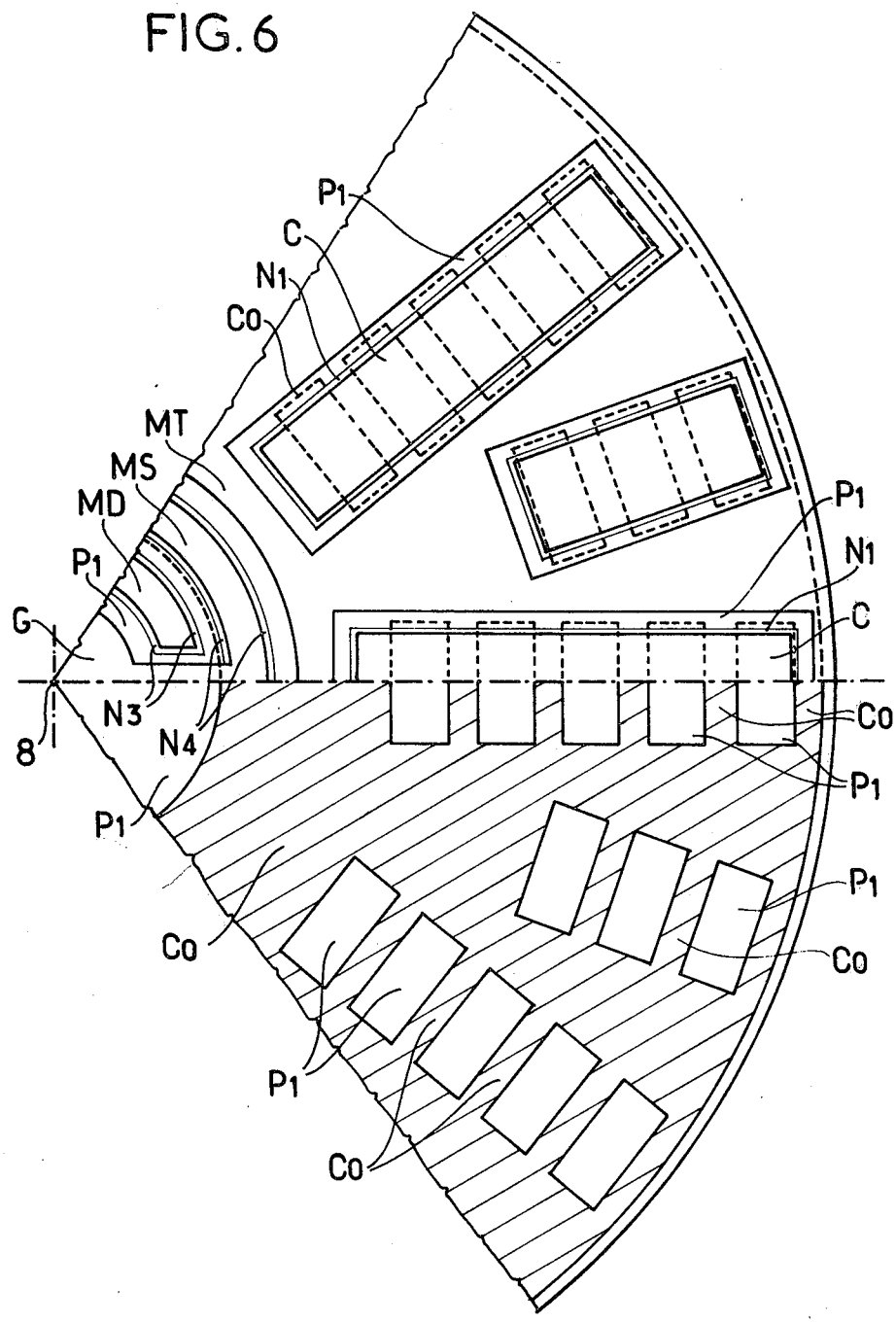

FIG. 5 is a cross-section view of the thyristor of FIG. 2 through a plane parallel to the cathode surface and passing in the thickness of the metallization formed in this face; and FIG. 6 is a view of the cathode surface of this same thyristor, a part of this surface being assumed to be transparent with shading in the zone occupied by the conduction layer situated in the thickness of the base, the edges of this conduction layer being shown in broken lines in the remaining part.

Figure 1:
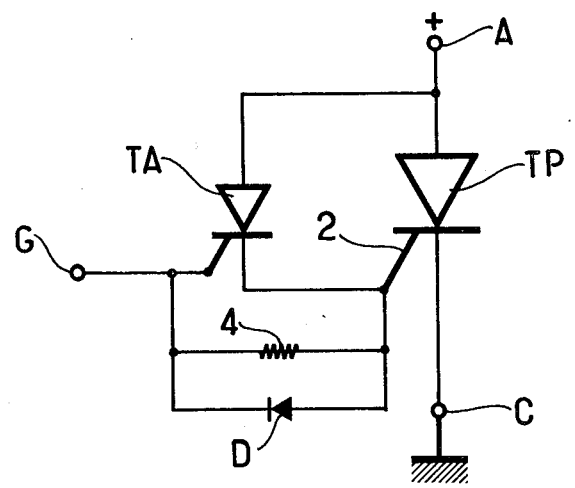
FIG. 1 is an equivalent circuit of a known G.T.O. amplifying gate thyristor, this circuit should make it easier to understand the operation of such a thyristor.

In accordance with FIG. 1, a main thyristor TP is provided with an anode brought to a positive potential and with a cathode C which is earthed. These electrodes are its main electrodes. Its control electrode 2 is supplied by means of an amplifying thyristor TA which amplifies the positive trigger signal applied to a gate G which constitutes the control electrode of this thyristor whose anode is connected to the anode A of the main thyristor TP and whose cathode supplies its control electrode 2. The gate G is also connected to this same control electrode 2 by a shunt diode D disposed to transmit negative pulses from the gate to the control electrode 2 and by a shunt resistance 4 in parallel, which resistance constitutes unavoidable stray resistance.

When it is required to trigger the main thyristor TP, a trigger signal constituted by a positive current pulse is applied to the gate G and triggers the amplifying thyristor TA. This thyristor supplies a high current which rapidly triggers the main thyristor TP. The shunt diode D does not pass the trigger signal.

When it is required to turn off the main thyristor TP while it is conductive, a negative pulse is applied to the gate. The shunt diode D short-circuits the control electrode/amplifying cathode junction of TA and transmits this negative pulse directly to the control electrode 2, thus turning off the main thyristor TP without danger of triggering the amplifying thyristor TA.

As will be seen, the elements which have just been described are to be found in an integrated form in the thyristor in accordance with the invention which will now be described and which further includes a conduction layer.

The concentrations of doping impurities will be given in numbers of impurity atoms per cubic centimeter. If a single number of atoms is indicated for one layer, this number will correspond to the point of this layer which has the greatest concentration.

The thyristor comprises a semiconductor structure constituted by a circular wafer of monocrystalline silicon with an axis of revolution 8, this wafer having an anode surface coated with metallization. A constituting an anode and a cathode surface coated partially with metallization C constituting a cathode.

Over its whole surface, this wafer forms a stack of semiconductor layers succeeding each other through its thickness. On the anode surface, there is the metallization forming the anode A. On this metallization, there is a P type semiconductor injection layer P2, 50 to 70 microns thick, with a concentration of $10^{20}$. On this injection layer, there is an N type blocking layer N2, 100 microns thick with a homogenous concentration of $1.5 \times 10^{14}$, then a P type base layer P1, 50 microns thick with a concentration of $10^{17}$. This base layer extends up to cathode surface. A conduction layer CO, 15 microns thick, with a concentration of $10^{19}$ is formed in the thickness of this layer and over a part only of the surface of the plate. This layer is separated from the blocking layer N2 by a thickness of 10 microns of the material of the base layer P1. A plurality of N type layers N1, N3 and N4 are formed in the cathode surface and have the same concentration, $10^{21}$, and penetrate into the base layer down to a same depth of 8 microns from the cathode surface.

A succession of concentric zones starting from the centre of the wafer can be distinguished on this surface:

A trigger zone ZG formed by the base layer P1 on which there is metallization constituting a gate G intended to receive positive control signals for triggering the thyristor and negative control signals for turning it off.

A trigger amplifying zone ZA in which is formed an N type trigger emitter N3 separated from the gate and coated with trigger metallization MD for the trigger emitter.

A turn off zone in which a shunt diode is formed by the layer P1 and an N type layer N4 formed in this base layer starting from the cathode surface. This layer N4 is separated from the trigger emitter and coated with shunt diode metallization MS connected to the gate G by metallization 10 shown normally in FIG. 5 and symbolically in FIG. 2 by a broken line and passing through an opening constituted by an interruption of the metallization MD.

A trigger transmission zone ZT is formed by the layer P1 partially coated with transmission metallization MT, which is separated from the metallization MS and connected to the trigger emitter metallization MD by metallization 12 which is shown normally in FIG. 5 and symbolically in FIG. 2 by a broken line and passing through an opening constituted by an interruption of the metallization MS. The transmission metallization MT comprises radial extensions such as 14 extending up to the periphery of the wafer to transmit up to this periphery a trigger signal collected by the metallization MD after having been amplified as previously set forth by means of the presence of the trigger emitter N3.

Lastly a main zone ZP occupying the greater part of the surface of the wafer between the extensions such as 14. In this zone a main emitter N1 is formed which is constituted by several sectors separated by the extensions such as 14 and coated with metallization constituting the cathode C and separated from the transmission metallization MT. The cross-section plane of FIG. 2 passes through one of these sectors.

Figure 4:
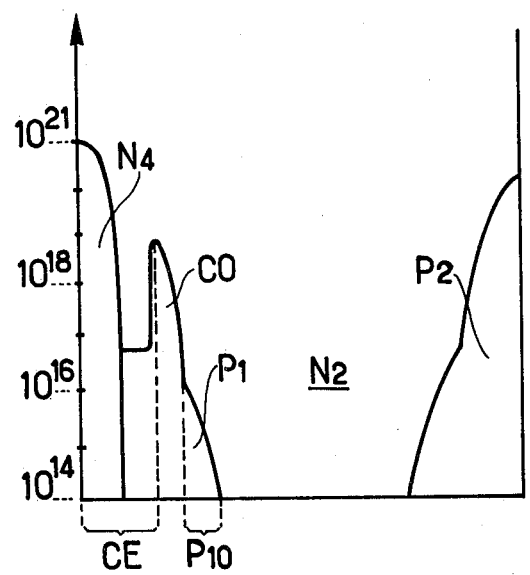

The thyristor thus constituted operates both when triggering and when turning off, in a known way which has been previously explained. In both cases, operation is improved by the presence of the conduction layer CO. This conduction layer CO is shown in FIGS. 2, 4 and 6.

It extends continuously under the transmission zone ZT and discontinuously under the main zone ZP, forming under the latter zone a grid whose bars such as 16 extend perpendicularly to the radial extensions such as 14 which form a part of the transmission zone. They make it possible to transmit the trigger signal from these extensions. The gaps existing between these bars prevent too great a number of negative carriers injected by the main emitter into the base P1 from being picked up while the thyristor is conductive by the numerous positive carriers presented in the layer CO. The concentration of doping impurities in this layer CO is chosen to be sufficiently high for its resistance per square ("area" or "layer" resistance) to be less than a third of that of the base layer P1. It is preferably close to a tenth of that of the base layer P1.

In accordance with the present invention, the conduction layer CO extends also in the turn off zone ZO, i.e. under the layer N4. This provides a very great advantage when the thyristor turns off by application of a negative pulse to the gate G: this pulse is transmitted to the layer N4 and as previously explained could trigger an unwanted thyristor consituted by the layers P2, N2, P1, and N4, thereby preventing the main thyristor from turning off. In the article by J. SHIMIZU et al. already cited it has been proposed to prevent the triggering of this unwanted thyristor by reducing the gain of the transistor N4, P1, N2.

However, no simple and effective means has been described to do this. In accordance with the invention, this gain is very greatly reduced by the simple extension of the conduction layer CO under the layer N4. Indeed, the negative carriers injected into the base P1 by the layer N4 cannot practically reach the blocking layer N2 without passing through the conduction layer CO within which they are captured by the very great number of positive carriers in this layer.

The extension of the highly conductive layer CO in the turn off zone also facilitates the transmission of the negative turn-off pulse, starting from the layer N4 towards the main zone. However, it would not be necessary, in order to do this, for the layer CO to extend as shown under the whole of the layer N4 or even to come near to the centre of the wafer beyond the inside edge of the layer N4. It would be sufficient for this purpose for the layer CO in the transmission zone ZT to come near to the outside edge of the layer N4 or to reach the vertical of this outside edge, if it is assumed that the wafer is horizontal.

When using the invention, it is on the contrary essential for the conduction layer CO to extend substantially under the whole of the layer N4 and it is preferable for it to extend beyond.

The thyristor which has just been described makes it possible to withstand a reverse voltage of 1000 V and a direct voltage of 1000 V in the blocked state and to conduct a current of 1000 A with a direct voltage drop of 2 V, if the area of the cathode C is 100 mm$^2$ for example.

It can be manufactured by passing through the following phases, starting from an initial N-type wafer of monocrystalline silicon whose concentration is that of the future layer N2 and whose thickness corresponds to that of the future layers P2, N2 and CO and of the part P10 of the layer P1 situated between the layers N2 and CO.

1. Two P type layers with low surface concentrations (about $10^{17}$) are formed by diffusion on both surfaces of this initial wafer, with a thickness of 15 microns so as to give a first doping to the future layer P2 on a lower surface and a final doping to the layer P10 and to the parts of the future layer P1 situated in the gaps of the future layers CO on the upper surface.

2. Windows are formed in the layer of oxide of the upper surface to allow the layer CO to be formed.

3. The layer CO is formed by diffusion with a surface concentration of $10^{19}$ and a thickness of 10 microns.

4. The oxide is removed from the upper surface.

5. A P type epitaxial layer CE of silicon with a resistivity of 1/100 ohm-centimeter and a thickness of 12 microns is deposited on this surface, the upper surface of this epitaxial layer constituting the cathode surface of the future thyristor.

6. The upper surface of the layer CE is oxidised.

7. Windows are formed in the oxide thus formed to allow the layers N1, N3 and N4 to be produced.

8. These layers are produced by diffusion with a surface concentration of $10^{21}$ and a thickness of 8 microns.

9. Minority carrier trapping centres made of gold or platinum are caused to be diffused from the upper surface, in the following conditions:
Source: layer deposited by cathode sputtering.
Duration: 1 hour at 840° C., for example.

10. A second P type diffusion is effected on the lower surface to bring the surface concentration to $10^{20}$ and thus to finish producing the layer P2 and an alloy of this surface is formed on a tungsten or molybdenum layer constituting the anode A.

11. Windows are formed in the oxide layer which has formed on the upper surface to allow the metallization at G, MD, MS and C to be formed.

12. The metallization is produced by evaporation of aluminium in a vacuum.

13. The layer of aluminium is removed from between the areas of metallization and at the periphery of the wafer.

14. Known junction protection treatments are effected.

15. The structure thus obtained is encapsulated and the metal connection terminals of the anode A, of the cathode C and of the gate G are installed.

Phases 1 to 9 hereinabove are particular to this type of thyristor, phases 10 to 15 being conventional for power thyristors.

What is claimed is:

1. An amplifying gate thyristor with gate turn off, comprising a semiconductor monocrystalline wafer with two surfaces which are an anode surface and a cathode surface and which are metallized, the surface of this wafer comprising five zones which succeed each other in the following order:

a gate zone;
a trigger amplification zone;
a turn off zone;
a trigger transmission zone;
and a main zone;

the wafer comprising in these five zones a stack of semiconductor layers and superimposed metallization in the following order starting from the anode surface;

an anode constituted by metallization;
a P type semiconductor injection layer;
an N type semiconductor blocking layer;
and a P type semiconductor base layer reaching in some places the cathode surface;

the wafer comprising; in the gate zone, a gate constituted by metallization deposited on the base layer; in the trigger amplification zone a trigger emitter separated from the gate and constituted by an N type semiconductor layer disposed on the base layer and coated with trigger emitter metallization in the turn off zone, a shunt diode constituted by an N type semiconductor layer disposed on the base layer, this N layer being separated from the trigger emitter and coated with covering shunt diode metallization connected to the gate, in the trigger transmission zone, transmission metallization deposited on the base layer, separated from the shunt diode metallization and connected to the trigger emitter metallization; in the main zone, a main emitter constituted by an N type layer disposed on the base layer and coated with a cathode constituted by metallization separated from the transmission metallization; and a conduction layer situated in the thickness of the base layer and constituted by a P+ type semiconductor layer, in which the doping concentration is higher than that of the base layer, this conduction layer extending over the turn off zone, the trigger transmission zone and the main zone, forming in the main zone a buried grid whose gaps are occupied by the material of the base layer so as to allow the negative carriers to pass through these gaps from the main emitter to the blocking layer.

2. A thyristor according to claim 1, wherein said conduction layer extends under the whole of the surface of said shunt diode and overlaps beyond the edge of this surface.

3. A thyristor according to claim 1, wherein that said conduction layer has a resistance per square of less than a third of the resistance per square of the said base layer.

* * * * *